United States Patent [19]
Yokoyama

[11] 3,987,369
[45] Oct. 19, 1976

[54] DIRECT-COUPLED FET AMPLIFIER

[75] Inventor: Kenji Yokoyama, Hamamatsu, Japan

[73] Assignee: Nippon Gakki Seizo Kabushiki Kaisha, Hamamatsu, Japan

[22] Filed: May 20, 1975

[21] Appl. No.: 579,082

[30] Foreign Application Priority Data
May 22, 1974 Japan............................ 49-58358[U]
May 22, 1974 Japan............................ 49-58359[U]

[52] U.S. Cl.................................. 330/35; 330/15; 330/17; 330/19; 330/30 D
[51] Int. Cl.²........................................... H03F 3/16
[58] Field of Search ................... 330/15, 17, 18, 19, 330/30 D, 35, 74

[56] References Cited
UNITED STATES PATENTS

| | | | |
|---|---|---|---|
| 3,092,783 | 6/1963 | Krohn ............................... | 330/74 X |
| 3,538,447 | 11/1970 | Johnson .......................... | 330/35 UX |
| 3,723,896 | 3/1973 | Flickinger..................... | 330/30 D X |

OTHER PUBLICATIONS
Dahlem, "Industrial Applications of Linear ICs", *The Electronic Engineer*, June 1967, pp. 72–77.

*Primary Examiner*—James B. Mullins
*Attorney, Agent, or Firm*—Cushman, Darby & Cushman

[57] ABSTRACT

A direct-coupled full stage cascaded amplifier comprising an output stage, a drive stage and a predrive stage. The output stage is composed of an SEPP (single-ended push-pull) circuit of a plurality of FET's having a certain conductivity type channel. The drive stage is composed of a differential amplifier circuit of a plurality of FET's having a channel of a conductivity type same as that of the FET's in the output stage. The pre-drive stage is composed of another differential amplifier circuit of a plurality of FET's having a channel of a conductivity type opposite to that of the FET's in the output stage. The source electrodes of the FET's in the respective differential amplifier circuits are connected via constant current circuits, respectively, to voltage supply lines having opposite polarities.

8 Claims, 2 Drawing Figures

DIRECT-COUPLED FET AMPLIFIER

BACKGROUND OF THE INVENTION

1. Field of the Invention

The present invention is concerned with a direct-coupled full stage cascaded amplifier having a pre-drive stage, a drive stage and an output stage, all of which stages being direct-coupled to each other. More specifically, the present invention pertains to an OCL (output capacitorless) amplifier of the type that FET's are used as the amplifier elements and that all of these stages are directly coupled to each other. This amplifier of the present invention can be used widely for many purposes such as amplification of audio signals, direct current amplification and pulse amplification.

2. Brief Description of the Prior Art

An FET has many excellent features such as presenting a high input impedance, a low noise index, a high gm (trans-conductance) and a high frequency characteristic, and accordingly, it has a quite superior utility as an amplifier element. Moreover, the FET has another feature that it is hardly affected by ambient temperature as compared with a bipolar transistor. As such, an FET (field effect transistor) is quite advantageous when used as an amplifier element especially when it is used as a component of a direct-coupled full stage cascaded amplifier to which changes in bias voltage are very undesirable.

Especially, the recent development of power FET's (vertical type FET's) has accelerated the use of power FET's in the field of power amplifier of audio signals.

In the past, however, a direct-coupled full stage cascaded amplifier utilizing FET's has been constructed by following the circuit arrangement of the direct-coupled full stage amplifier utilizing bipolar transistors. Accordingly, it has not been possible to make full use of the unique features of FET's. Furthermore, according to the known art, the circuit arrangement, especially the arrangement of the biasing circuit, has been complicated, and such a circuit arrangement of the prior art has been susceptible to the effect of the ambient temperature, and what is more, the control of the bias voltage has been difficult to make. In view of these aspects, it has been extremely difficult to materialize the so-called OCL amplifier without an output capacitor, in the form of direct-coupled full stage cascaded amplifier arrangement.

SUMMARY OF THE INVENTION

It is, therefore, a principal object of the present invention to provide a direct-coupled full stage OCL cascaded amplifier which uses FET's as the amplifier elements.

Another object of the present invention is to provide a direct-coupled full stage cascaded OCL amplifier of the type described above, which is not affected by the changes in the ambient temperature and power source voltage.

Still another object of the present invention is to provide a direct-coupled full stage cascaded OCL amplifier of the type described above, which is simple in the arrangement of the biasing circuit, especially the bias circuit in the output stage and which is simple in the control of the bias voltage.

A further object of the present invention is to provide a direct-coupled full stage cascaded OCL amplifier of the type described above, which will not cause breakage of the FET's in the output stage due to the overdriving of these FET's when an excessively large input signal is applied.

These as well as other objects and features of the present invention will become apparent by reading the following detailed description of the present invention when taken in conjunction with the accompanying drawings.

DETAILED DESCRIPTION OF THE PREFERRED EMBODIMENTS

Figure 1:
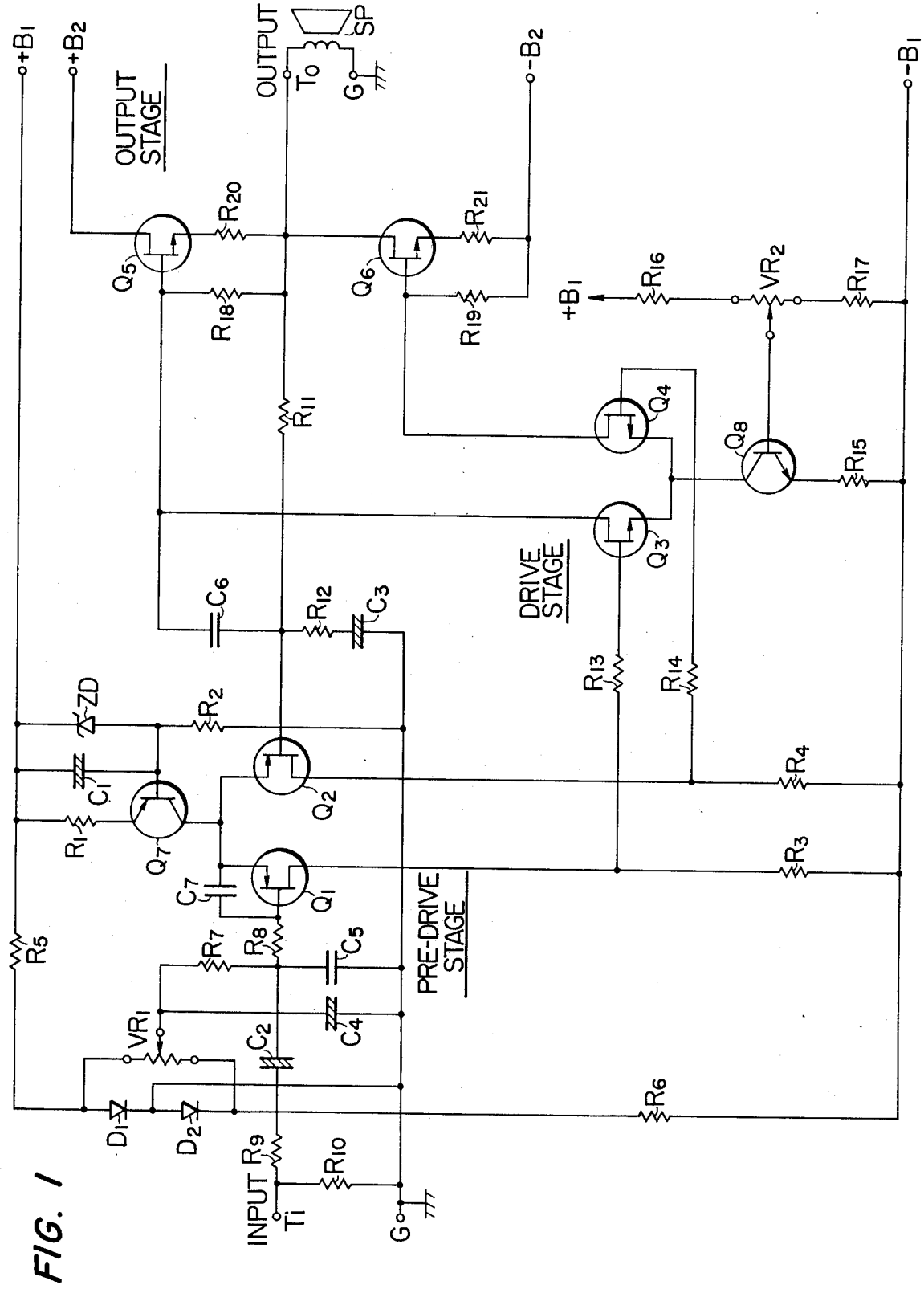
FIG. 1 is an electric circuit diagram showing an example of the direct-coupled full stage cascaded OCL amplifier according to the present invention.

Referring now to FIG. 1, there is shown an example of the direct-coupled full stage cascaded OCL amplifier arrangement according to one aspect of the present invention. This amplifier comprises generally: a pre-drive stage which is constructed of a differential amplifier circuit formed with a p-channel FET's $Q_1$ and $Q_2$; a drive stage which is constructed of a differential amplifier circuit formed with n-channel FET's $Q_3$ and $Q_4$; and an output stage which is constructed of an SEPP (single-ended push-pull) circuit formed with n-channel power FET's $Q_5$ and $Q_6$.

The source electrodes of the FET's $Q_1$ and $Q_2$ in said pre-drive stage are connected to a voltage supply source $+B_1$ having a positive polarity via a known common constant current circuit which is composed of a bipolar transistor $Q_7$, resistors $R_1$ and $R_2$, Zener diode ZD and a noise eraser capacitor $C_1$. The drain electrodes of the FET's $Q_1$ and $Q_2$ are connected via drain load resistors $R_3$ and $R_4$ to a voltage supply source $-B_1$ having a negative polarity. On the other hand, to the gate electrode of the FET $Q_1$ is applied, via resistors $R_7$ and $R_8$, a bias voltage which is obtained by dividing, by a variable resistor $VR_1$, the voltage across the terminals of the diodes $D_1$ and $D_2$ which are connected in series, via resistors $R_5$ and $R_6$, between the voltage supply sources $+B_1$ and $-B_1$. Also, the gate electrode of this FET $Q_1$ is connected to a signal input terminal $T_i$ via resistors $R_8$ and $R_9$ and a capacitor $C_2$. The gate electrode of the FET $Q_2$, on the other hand, is connected to an output terminal $T_o$ via a feed-back circuit network which is composed of resistors $R_{11}$ and $R_{12}$ and a capacitor $C_3$. An input resistor $R_{10}$ is connected between said input terminal $T_i$ and a ground terminal G. Between the center tap of said variable resistor $VR_1$ and said ground terminal G is connected a capacitor $C_4$ for erasing the noise generated from said diodes $D_1$ and $D_2$ and for effecting de-coupling. $C_5$ represents a capacitor for cutting off a high frequency range, whereas $C_7$ represents a capacitor for phase compensation.

The gate electrodes of the FET's $Q_3$ and $Q_4$ in the drive stage are direct-connected, via resistors $R_{13}$ and $R_{14}$, respectively, to the drain electrodes of the FET's $Q_1$ and $Q_2$ in the pre-drive stage. Also, the source electrodes of the FET's $Q_3$ and $Q_4$ are connected to the voltage supply source $-B_1$ via a common constant current circuit which is composed of a bipolar transistor $Q_8$, a resistor $R_{15}$, resistors $R_{16}$ and $R_{17}$ and a variable resistor $VR_2$. The drain electrodes of the FET's $Q_3$ and $Q_4$ are connected, via drain load resistors $R_{18}$ and $R_{19}$, to the output terminal $T_o$ and to a main power source $-B_2$ having a negative polarity.

The drain electrode of the FET $Q_5$ in the output stage is connected to a main power source $+B_2$ having a positive polarity, and the source electrode of this FET $Q_5$ is connected to the output terminal $T_o$ via a resistor $R_{20}$ which is assigned for suppressing the flow of an excessively large current beyond a rated value. Also, the drain electrode of the FET $Q_6$ is connected to the output terminal $T_o$, and the source electrode of this FET $Q_6$ is connected to said main power source $-B_2$ having a negative polarity via a resistor $R_{21}$ assigned for suppressing the flow of an excessively large current beyond a rated value. The gate electrodes of these FET's $Q_5$ and $Q_6$, on the other hand, are connected directly to the drain electrodes of the FET's $Q_3$ and $Q_4$ in the drive stage.

The symbol SP represents a speaker which is connected between the output terminal $T_o$ and the ground terminal G as a load of the amplifier. Also, $C_6$ represents a phase compensation capacitor.

This example intends to effect power amplification of mainly audio signals, wherein both the pre-drive stage and the drive stage are assigned to carry out A-class amplifying operation, whereas the output stage is assigned to perform AB or B-class push-pull amplifying operation. More specifically, the input signal (audio signal) which is applied to the input terminal $T_i$ is subjected to phase-inverted amplification by both the pre-drive stage and the drive stage, and thereafter the resulting amplified signal is applied to the gate electrodes of the FET'S $Q_5$ and $Q_6$ in the output stage where this signal is amplified in push-pull mode and applied to the speaker SP.

Now, in the OCL amplifier, it is necessary to keep the potential of the output terminal $T_o$ at the mid-point potential, i.e. the ground potential, when no signal is inputted. Thus, the potential of the input terminal of the output stage, i.e. the potential of the gate electrodes of the FET's $Q_5$ and $Q_6$, will be accordingly determined. In case of a direct-coupled full stage cascaded OCL arrangement, however, the potential of the input terminal of the drive stage, i.e. the potential of the gate electrodes of the FET's $Q_3$ and $Q_4$, is determined by the potential of the output terminal of the pre-drive stage, i.e. the potential of the drain electrodes of the FET's $Q_1$ and $Q_2$. As such, there arises the tendency that the potential of the output terminal of the drive stage becomes non-conformable to the input potential of the output stage. Therefore, in the past, there has been provided, on for example the output side of the drive stage, a voltage shifting circuit such as a series circuit of diodes, so as to have the output potential of the drive stage correspond to the input potential of the output stage. Thus, the entire circuit arrangement tended to become complicated. Moreover, the stability of the bias voltage tended to become poor, and in addition the bias voltage was troublesome and difficult to adjust.

In good contrast to the prior art having the aforesaid disadvantages and inconveniences, the amplifier according to the present invention provides the arrangement that both the pre-drive stage and the drive stage are used as the differential amplifier circuits composed of FET's, and that the source electrodes of the FET's in the respective differential amplifier circuits are connected, via common constant current circuits, respectively, to the voltage supply sources $+B_1$ and $-B_1$ having opposite polarities, respectively. Thus, there is no need of providing any voltage shifting circuit, and it is possible to directly couple the pre-drive stage to the drive stage and to directly couple the drive stage to the output stage. Since the pre-drive stage and the drive stage are invariable differential amplifier circuits, there arises very little variation in the bias voltage due to the changes in the ambient temperature and to the fluctuations in the voltage of the voltage supply sources $\pm B_1$. In particular, in the present invention, the source electrodes of the FET's of the respective differential amplifier circuits are arranged to be regulated of their current. Thus, the aforesaid advantages of the present invention can be insured all the more positively.

Furthermore, according to the present invention, the drain load resistors $R_{18}$ and $R_{19}$ of the FET's $Q_3$ and $Q_4$ are connected in parallel between the gate electrodes and the source electrodes of the FET's $Q_5$ and $Q_6$ in the output stage and the voltage drop of the FET's $Q_5$ and $Q_6$ in the output stage and the voltage drop of the drain current which develops across the terminals of these resistors $R_{18}$ and $R_{19}$ is arranged to be inputted as a bias voltage to the gate electrodes of the FET's $Q_5$ and $Q_6$. Accordingly, it will be understood that, by altering the drain current of the FET's $Q_3$ and $Q_4$ by adjusting the variable resistor $VR_2$, it is possible to very easily control the respective gate bias voltages of the FET's $Q_5$ and $Q_6$ simultaneously while keeping a well-balanced operational condition.

On the other hand, it is commonly known that the differential amplifier circuits which constitute the pre-drive stage and the drive stage have the function of serving as limiter circuits. As such, even in case an excessively large input signal beyond a rated value is applied to the input terminal $T_i$, it will never happen that the FET's $Q_5$ and $Q_6$ of the output stage are overdriven and thus there is no fear that they are broken.

In the above-discussed example, the direct current component of the output voltage is arranged also to be fed back to the pre-drive stage. Therefore, this arrangement also contributes to the stabilization of the bias voltage.

Figure 2:
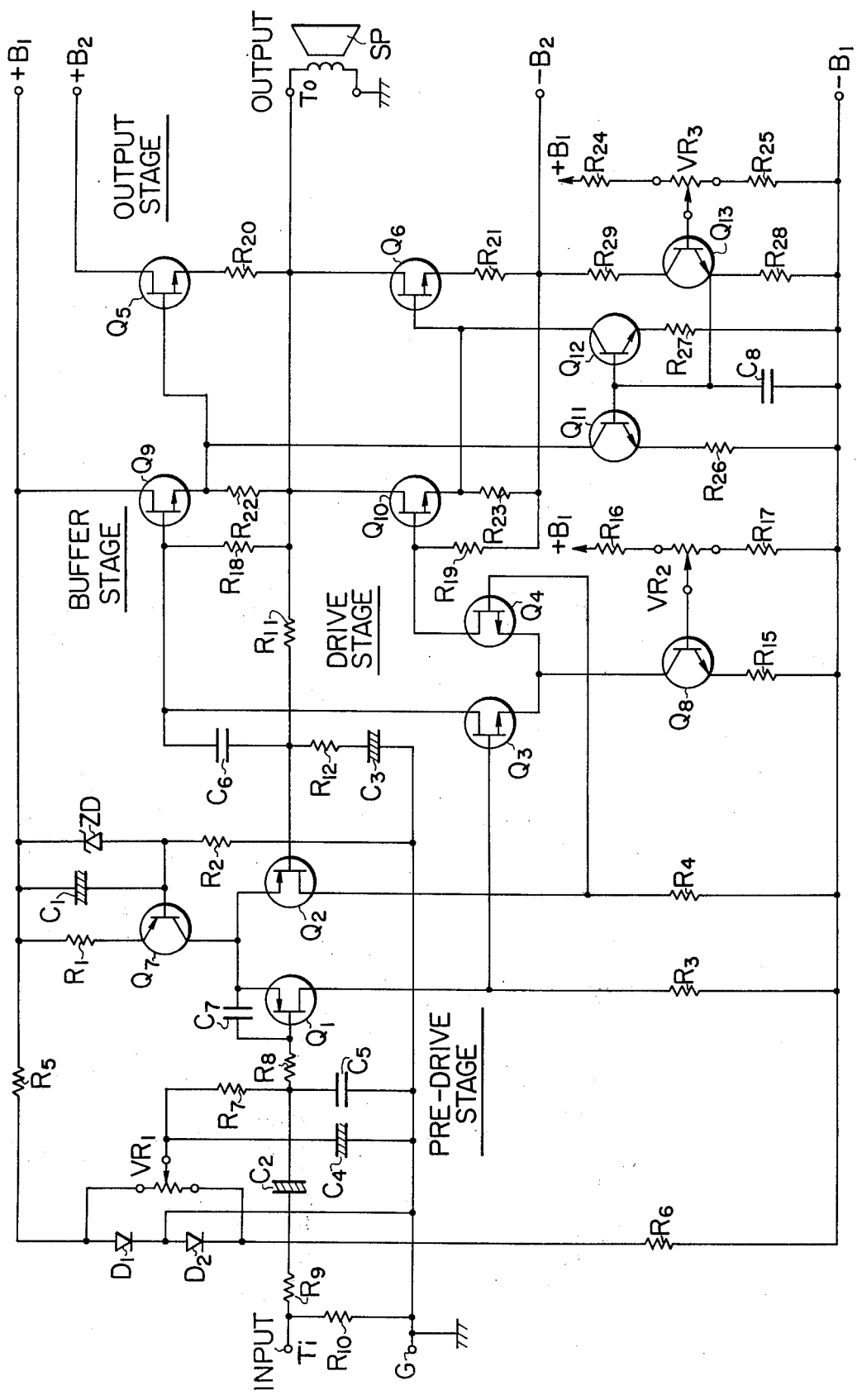
FIG. 2 is an electric circuit diagram showing another example of the direct-coupled full stage cascaded OCL amplifier according to another aspect of the present invention.

FIG. 2 shows a modified example. In this example, there is provided, in the foreground of the output stage, a buffer stage of a source-follower circuit which is composed on n-channel FET's $Q_9$ and $Q_{10}$. Also, between the gate electrodes and the source electrodes of these FET's $Q_9$ and $Q_{10}$ are connected, in parallel, drain load resistors $R_{18}$ and $R_{19}$ of the FET's $Q_3$ and $Q_4$ in the drive stage. Furthermore, in order to impart a bias voltage to the gate electrodes of the FET's $Q_5$ and $Q_6$ in the output stage, there is provided a constant current circuit which is composed of npn type bipolar transistors $Q_{11}$ and $Q_{12}$, resistor $R_{26}$ and $R_{27}$ which are connected to the emitters of these bipolar transistors $Q_{11}$ and $Q_{12}$, and a capacitor $C_8$ which is connected to the bases of these transistors $Q_{11}$ and $Q_{12}$, and using the source load resistors $R_{22}$ and $R_{23}$ of the FET's $Q_9$ and $Q_{10}$ as the collector loads of said bipolar transistors $Q_{11}$ and $Q_{12}$. The respective bases of the bipolar transistors $Q_{11}$ and $Q_{12}$ are connected to the emitter of an *npn* type bipolar transistor $Q_{13}$. This bipolar transistor $Q_{13}$ constitutes an emitter follower circuit with a resistor $R_{24}$, a variable resistor $VR_3$ and a resistor $R_{25}$ which are serially connected relative to each other and are connected to the base of the bipolar transistor $Q_{13}$ and to voltage supply sources $+B_1$ and $-B_1$, respectively. To the base electrode of this bipolar transistor $Q_{13}$ is applied a voltage obtained by dividing the voltage between the voltage supply sources $+B_1$ and $-B_1$ by a network composed of the resistors $R_{24}$ and $R_{25}$ and the variable resistor $VR_3$. By adjusting the resistance value of the variable resistor $VR_3$, the base potential of the bipolar transistor $Q_{13}$ is varied, to thereby vary the base potentials of the bipolar transistors $Q_{11}$ and $Q_{12}$. Whereby, the value of the current flowing through the collectors of these transistors $Q_{11}$ and $Q_{12}$, i.e. the value of current flowing through the constant current circuit is varied.

To the gate electrodes of the FET's $Q_5$ and $Q_6$ in the output stage is applied, as a bias, the voltage drop which develops in the resistors $R_{22}$ and $R_{23}$ due to the difference current between the drain currents of the FET's $Q_9$ and $Q_{10}$ and the collector currents of the transistors $Q_{11}$ and $Q_{12}$. This bias can be arbitrarily adjusted by adjusting the variable resistor $VR_3$. On the other hand, between the gate electrodes and the source electrodes of the FET's $Q_9$ and $Q_{10}$ in the buffer stage is applied, as the bias voltage, the difference voltage between the voltage drop which is developed in the source load resistors $R_{22}$ and $R_{23}$ and the voltage drop developed in the drain load resistors $R_{18}$ and $R_{19}$ of the FET's $Q_3$ and $Q_4$ of the drive stage.

Since the internal impedance of the transistors $Q_{11}$ and $Q_{12}$ is very high, it will be understood that even when these transistors $Q_{11}$ and $Q_{12}$ are connected in parallel to the gate circuits of the FET's $Q_5$ and $Q_6$, there will hardly arise any ill effect on the signals. It will be understood also that these transistors $Q_{11}$ and $Q_{12}$ may be replaced by n-channel FET's having pentode vacuum tube characteristic having a high internal impedance.

Excepting the points discussed above, this second example is similar in arrangement and function to that shown in FIG. 1. Thus, like parts are indicated by like reference numerals and symbols throughout FIGS. 1 and 2.

In the examples discussed above, the output stage and the drive stage are composed of n-channel FET's, whereas the pre-drive stage is composed of p-channel FET's. It should be understood, however, that these stages may be composed of p-channel FET's and n-channel FET's, respectively. In this latter case, however, the polarity of the power supply sources $+B_1, -B_1, +B_2$ and $-B_2$ have to be inverted, respectively. In the present invention, a direct current cut-off capacitor $C_2$ is inserted between the pre-drive stage and the input terminal $T_i$. It should be understood, however, that in case it is intended to effect direct current amplification, it is only necessary to alter the arrangement of the bias circuit of the FET $Q_1$ so as to be able to omit said capacitor $C_2$.

The present invention has been described with respect to the illustrated examples. It should be understood, however, that the present invention is not limited to these specific examples other than it is limited in the appending claims and that any wide modifications may be made as required.

I claim:
1. An amplifier comprising:
a first main power source of a first polarity;
a second main power source of a second polarity which is opposite to the first polarity;
an output stage constituting a single-ended push-pull circuit composed of a first and a second FET both of a first conductivity type channel, the drain of said first FET being connected to said first power source, the source of said second FET being connected to said second power source, and the source of said first FET and the drain of said second FET being connected together forming an output terminal;

a drive stage constituting a differential amplifier circuit composed of FET's having the first conductivity type channel, drain load resistors connected to the respective drains of these FET's, and a constant current circuit connected between the sources of both these FET's and a voltage supply line having said second polarity, the respective drains of these FET's being connected to the gates of said first and second FET's in said output stage; and a pre-drive stage constituting another differential amplifier circuit composed of FET's having a second conductivity type channel which is opposite to said first conductivity type, and another constant current circuit connected between the sources of both these FET's and another voltage supply line having said first polarity, the respective drains of these FET's being connected to the gates of said FET's in said drive stage.

2. An amplifier according to claim 1, in which the drain load resistors of the FET's in said drive stage are respectively connected between the gate electrodes and the source electrodes of the FET's in said output stage.

3. An amplifier according to claim 1, in which said drive stage includes a circuitry for varying the value of the electric current flowing through said constant current circuit in said drive stage.

4. An amplifier comprising:
a pre-drive stage;
a drive stage direct-coupled to said pre-drive stage;
a buffer stage direct-coupled to said drive stage;
an output stage direct-coupled to said buffer stage;
constant current circuits;
a first power source of a first polarity; and
a second power source of a second polarity which is opposite to the first polarity,
said output stage constituting a single-ended push-pull circuit composed of a first and a second FET both of a first conductivity type channel, the drain of said first FET being connected to said first power source, the source of said second FET being connected to said second power source, and the source of said first FET and the drain of said second FET being connected together forming an output terminal,
said buffer stage constituting a source follower circuit composed of FET's both of the first conductivity type channel and source load resistor,
said drive stage constituting a differential amplifier circuit composed of FET's having the first conductivity type channel and drain load resistors,
said pre-drive stage constituting another differential amplifier circuit composed of FET's having a second conductivity type channel which is opposite to said first conductivity type,
each of said constant current circuits being respectively connected to each of said source load resistors, for causing currents opposite in direction to the source currents of said FET's of said buffer stage to flow through said source load resistors.

5. An amplifier according to claim 4, in which said constant current circuits include a circuitry for varying the values of the electric currents flowing through these constant current circuits.

6. An amplifier according to claim 4, in which the gate electrodes of the FET's in said buffer stage and, via said source load resistors, the source electrodes of these FET's are connected across said drain load resistors of the FET's in said drive stage.

7. An amplifier according to claim 4, in which the source of the FET's in said drive stage are connected, via another common constant current circuit, to a voltage supply line having said second polarity, and in which the source of the FET's in said pre-drive stage are connected, via still another common constant current circuit, to another voltage supply line having said first polarity.

8. An amplifier according to claim 7, in which said another constant current circuit of said drive stage includes a circuitry for varying the value of the electric current flowing through this constant current circuit.

* * * * *